United States Patent
Santos et al.

(10) Patent No.: US 8,963,305 B2
(45) Date of Patent: Feb. 24, 2015

(54) METHOD AND APPARATUS FOR MULTI-CHIP STRUCTURE SEMICONDUCTOR PACKAGE

(71) Applicant: Freescale Semiconductor, Inc., Austin, TX (US)

(72) Inventors: Fernando A. Santos, Chandler, AZ (US); Audel A. Sanchez, Tempe, AZ (US); Lakshminarayan Viswanathan, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 119 days.

(21) Appl. No.: 13/624,232

(22) Filed: Sep. 21, 2012

(65) Prior Publication Data
US 2014/0084432 A1   Mar. 27, 2014

(51) Int. Cl.
*H01L 23/495* (2006.01)
*H01L 23/48* (2006.01)

(52) U.S. Cl.
USPC .... 257/676; 257/666; 257/783; 257/E23.031; 257/E23.051

(58) Field of Classification Search
CPC ............ H01L 23/49513; H01L 23/3677; H01L 23/4334; H01L 224/49051; H01L 224/4909; H01L 224/4809
USPC ............... 257/666, 676, E23.051, 783
See application file for complete search history.

(56) References Cited

U.S. PATENT DOCUMENTS

| | | | |
|---|---|---|---|
| 5,027,189 A * | 6/1991 | Shannon et al. | 257/783 |
| 5,034,568 A | 7/1991 | Mather | |
| 5,068,708 A | 11/1991 | Newman | |
| 5,208,188 A | 5/1993 | Newman | |
| 5,237,205 A | 8/1993 | Newman | |
| 5,596,225 A * | 1/1997 | Mathew et al. | 257/667 |
| 5,665,996 A * | 9/1997 | Williams et al. | 257/401 |
| 6,144,104 A * | 11/2000 | Baker et al. | 257/783 |
| 6,465,883 B2 | 10/2002 | Olofsson | |
| 6,798,295 B2 | 9/2004 | Pengelly et al. | |
| 6,917,097 B2 | 7/2005 | Chow et al. | |
| 7,445,967 B2 | 11/2008 | Abdo et al. | |
| 7,846,773 B2 | 12/2010 | Galera et al. | |
| 7,868,471 B2 | 1/2011 | Camacho et al. | |
| 7,932,586 B2 * | 4/2011 | Chen et al. | 257/675 |
| 2005/0212140 A1 * | 9/2005 | Fujinaga et al. | 257/772 |
| 2006/0043609 A1 * | 3/2006 | Brennan et al. | 257/784 |
| 2008/0191342 A1 | 8/2008 | Otremba | |
| 2008/0272475 A1 | 11/2008 | Dijkstra et al. | |
| 2009/0051019 A1 | 2/2009 | Huang et al. | |
| 2009/0079050 A1 | 3/2009 | Steenbruggen et al. | |
| 2009/0085229 A1 | 4/2009 | Wu et al. | |
| 2009/0115039 A1 * | 5/2009 | Zhu et al. | 257/676 |
| 2009/0212403 A1 * | 8/2009 | Liu et al. | 257/666 |
| 2010/0193942 A1 | 8/2010 | Railkar et al. | |
| 2010/0230790 A1 * | 9/2010 | Disney | 257/666 |

FOREIGN PATENT DOCUMENTS

WO   0003435 A2   1/2000

* cited by examiner

*Primary Examiner* — Nitin Parekh

(57) ABSTRACT

A packaged semiconductor device may include a leadframe and a die carrier mounted to the leadframe. The die carrier is formed from an electrically and thermally conductive material. A die is mounted to a surface of the die carrier with die attach material having a melting point in excess of 240° C. A first electrical interconnect couples the die and the leadframe. A housing covers portions of the leadframe, die carrier, die and first electrical interconnect.

20 Claims, 5 Drawing Sheets

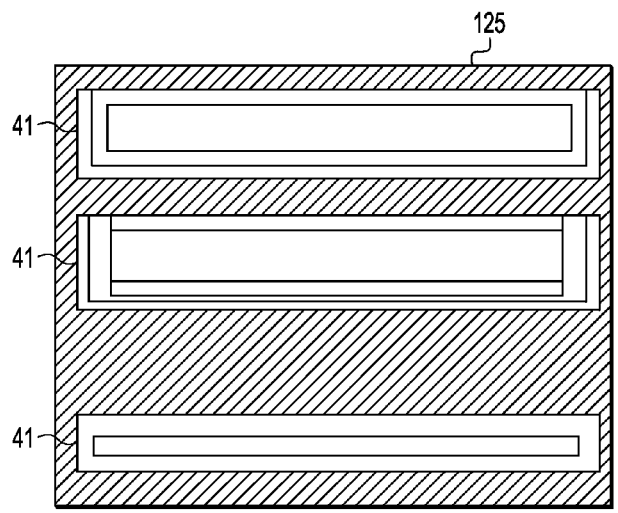
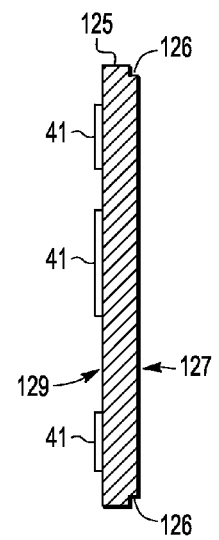
FIG. 3A  FIG. 3B
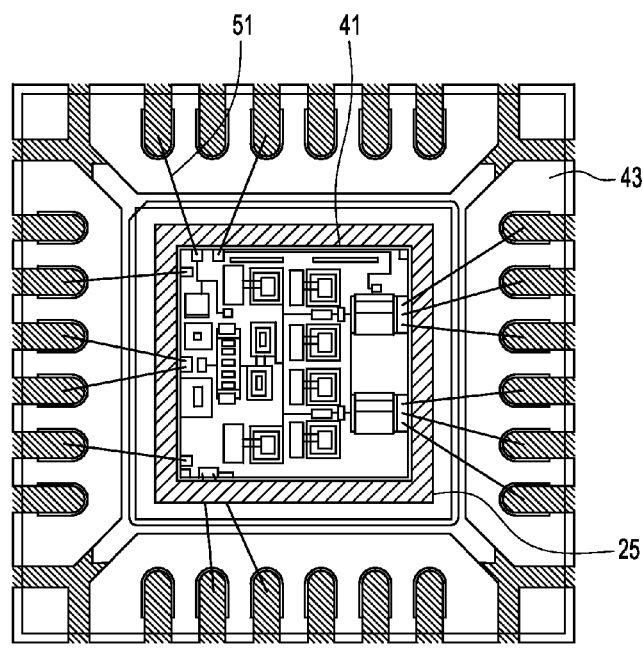
FIG. 4

METHOD AND APPARATUS FOR MULTI-CHIP STRUCTURE SEMICONDUCTOR PACKAGE

BACKGROUND OF THE INVENTION

1. Field of the Disclosure

The present invention relates in general to electronic devices, and, in particular, to semiconductor packages.

2. Description of the Related Art

Semiconductor die are encapsulated in a semiconductor package for protection from damage by external stresses and to provide a system for carrying electrical signals to and from the die. Many different types of semiconductor packages exist, including dual-in-line packages, pin grid array packages, tape-automated bonding (TAB) packages, multi-chip modules (MCMs), and high power packages. Typically, power packages for semiconductor devices use relatively high resistivity die attach materials to connect one or more semiconductor die to a portion of the power package. Such die attach materials have a high lead content, a large thickness, and a low thermal conductivity of approximately 20 to 30 watts per meter Kelvin (W/m-K). Each of these characteristics contributes to a reduction in heat transfer characteristics during device operation. These power packages also typically have an air cavity defined by surrounding ceramic components, which are expensive. Furthermore, these power packages are typically limited to housing a single semiconductor die per package, which requires: (1) implementing non-power components that are preferably matched and located on the same chip as the high power semiconductor components, which can result in lossy devices with poor electrical performance; or (2) implementing matching components on one or more different semiconductor die in different packages, which requires a larger footprint or a larger amount of space in the final product for multiple packages.

One type of power package used for a high power semiconductor device is capable of dissipating greater than ten watts of power. A need exists for a package for a high power semiconductor device that has improved thermal conductivity for improved reliability, that is less expensive than ceramic-based packages, and that can be used to package multiple semiconductor die in a single package.

BRIEF DESCRIPTION OF THE DRAWINGS

So that the manner in which the features and advantages of the embodiments are attained and can be understood in more detail, a more particular description may be had by reference to the embodiments thereof that are illustrated in the appended drawings. However, the drawings illustrate only some embodiments and therefore are not to be considered limiting in scope as there may be other equally effective embodiments.

FIGS. 3A and 3B are top and side views of another embodiment of a portion of a packaged SD;

FIG. 4 is a top view of an embodiment of a portion of a packaged SD having a leadless leadframe;

The use of the same reference symbols in different drawings indicates similar or identical items.

DETAILED DESCRIPTION

Specific embodiments described herein entail a packaged device that includes one or more devices, such as one or more semiconductor die, mounted in a package that is suitable for high power applications with or without the use of a lead frame. The packaged device includes a die carrier. The term "die carrier" as used herein is intended to include a thermally and electrically conductive structure. Examples of die carriers may include one or more of the following materials: Cu, CuMo, Al, AlSiC, Aluminum-diamond material, Cu-graphite, Ag-diamond, or still other thermal and electrically conductive structures. Some embodiments have no separate lead frame structure, which is typically included to connect the input and output of a device to a circuit board. The components to be packaged can be attached to the die carrier using a high temperature die attach process. The die carrier and component combination can then be housed, such as in an encapsulant (e.g., a plastic material). As used herein, the term 'housing' as used herein is intended to refer to either a solid overmolded structure or an air housing or cavity without encapsulant material abutting a surface of the die. Such a technique facilitates packaging flexibility and achieves improvements in wire bond quality. Accordingly, a package with enhanced performance and improved reliability can be achieved for high power radiofrequency applications.

Figure 1:
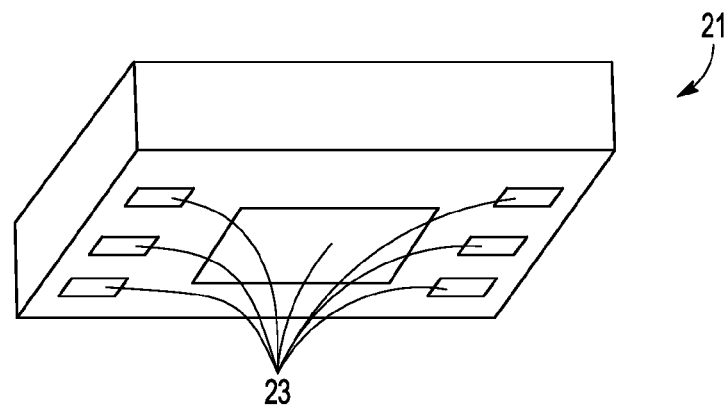
FIG. 1 is a perspective view of an embodiment of a packaged semiconductor device (SD)

Referring to FIG. 1, one embodiment of a packaged semiconductor device (SD) 21, such as a radio frequency (RF) device, comprises a plurality of terminations 23 configured as leadless interconnects to be surface mount attached to a PCB (not shown).

Figure 2:
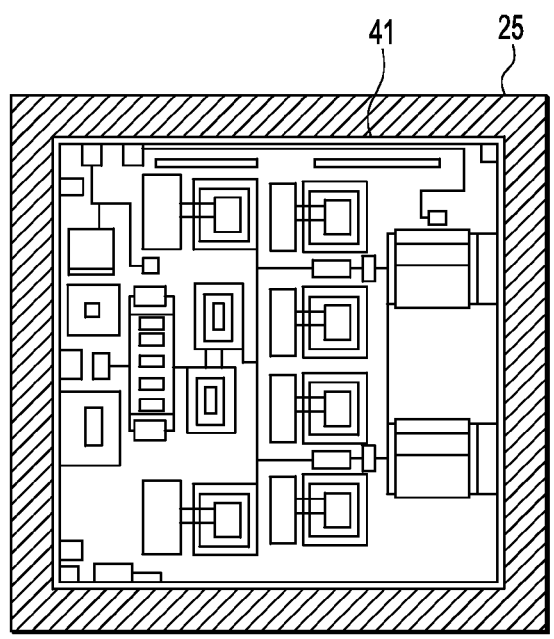
FIG. 2 is a top view of a portion of a packaged SD in accordance with an embodiment of the disclosure.

FIGS. 2, 3A and 3B illustrate embodiments packaged SD 21, which includes a die carrier 25, 125. In FIG. 2, a die carrier 25 with a single die 41 is shown from a top view. In FIGS. 3A and 3B, views of a die carrier 125 with a plurality of die 41 are shown from a top view and a side view, respectively. The die may comprise, for example, GaN, GaAs or other materials. The die carrier 125 has a first surface 127 and a second surface 129. The first surface 127 may comprise one of the terminations 23 illustrated at FIG. 1. The second surface 129 is opposite the first surface 127 and can be substantially parallel to the first surface 127. The die carrier 125 is electrically and thermally conductive, and may have a thickness of about 10 mils to about 40 mils. In some embodiments, the die carrier 125 may have a thickness of less than 30 mils, such as less than 28 mils, or even less than 25 mils. The die and die carrier may comprise a combined thickness that is substantially equal to a thickness of the leadframe (not shown). The die carrier may be thicker than the leadframe.

Embodiments of the die carrier (e.g., die carriers 25, 125) illustrated herein may be thermally and electrically conductive, such as a ductile material layer or a laminate material. The term "thermally conductive" as used herein is intended to mean a thermal conductivity of at least 150 W/m-K. A laminate may comprise a layered material with a plurality of layers of metal, metal composites and combinations thereof. For example, a three layer composite could include a copper-only layer, a copper-molybdenum composite layer, and another copper layer. Other compositions and/or materials also may be considered laminates. In some embodiments, the die carrier may be a single die carrier, or an array of interconnected die carriers (not shown), as known to those skilled in the art. The die carrier is sized to accommodate one or more semiconductor dies 41 in accordance with the particular design of the package. In an embodiment, locations of a die carrier may be selectively plated to provide a portion of the surface of the die carrier suitable for a subsequent die attach operation.

As described herein, one or more semiconductor dies 41 may be coupled to the die carrier 25, 125. In an embodiment, the semiconductor dies may be high power die, e.g., greater than 10 watts, such as greater than about 10 watts to about 200 watts. Thus, in some embodiments, the packaged SD may have a power capacity or power rating of about 10 W to about 200 W. Power also depends on die technology, voltage used, etc. In addition, the packaged SD may be configured to operate at radio frequencies of about 3 kHz to about 100 GHz, such as about 3 kHz to about 10 GHz. Typical sizes of the die carriers may comprise 200×200 mils, 400×400 mils, 240× 650 mils, 260×650 mils, 800×400 mils, or 1200×500 mils.

The die 41 may comprise active or passive components. For example, an active component can include such a semiconductor die that includes transistors, such as a die having microprocessor, a die having memory, and the like. An active component may be a high power (e.g., greater than 10 watts) radio frequency die. A passive component can include a capacitor, inductor, resistor, and the like. Die other than those illustrated can be mounted to other die carriers. Each die 41 may have the same or different thickness, which can be about 3 mils to about 5 mils, or about 1 mil to about 10 mils in other embodiments.

In some embodiments, at least one of the die carrier and the leadframe comprises a textured feature on a surface opposite to the die. The textured feature facilitates engagement, such as registration, between the die carrier and leadframe. For example, in FIG. 3B, the die carrier 125 can comprise a textured feature 126 on a surface opposite to the die 41. The textured feature may comprise at least one of a textured surface, knurling, mold lock edges and a surface finish that differs from that of a surface on which the die is located. In an embodiment illustrated at FIG. 3B, the textured feature 126 is mold lock edges extending along a periphery of the surface opposite to the die 41, such that the leadframe and die carrier couple together along the textured feature. For example, the mold lock edges may be complementary to and couple with an aperture in the leadframe.

The radio frequency semiconductor dies may be attached to a surface of the die carrier using a high temperature bonding process, such as a gold-silicon eutectic bonding die attach process. In such an embodiment, the thickness of the die carrier may be of suitable thickness, for example, at least about 25 mils, in order to withstand the high temperatures (e.g., greater than 400° C.) needed for gold-silicon eutectic bonding without damage. Other suitable thicknesses also may be employed depending on the application.

In some embodiments, the die attach material 42 (FIG. 6) comprises an element that is not present in the die carrier 25, 125. For example, the element that is not present in the die carrier may be gold, silver, silicon, tin, the like, and combinations thereof, such as AuSi eutectic, AuSn and sintered Ag. In other examples, the die attach material may comprise at least one of gold, silver, tin, the like, and combinations thereof, such as AuSi eutectic, AuSn, and sintered Ag.

The die attach material 42 may comprise a Pb-free metallic system that forms a metallurgical joint. Embodiments of the die attach material 42 may have a melting point in excess of 240° C., or in excess 260° C. For example, the following materials can be used to attach the one or more dies 41 to the second surface: AuSi, AuSn, or Ag. The approximate melting points of these materials are: AuSi, ~360° C.; AuSn, ~280° C.; and Ag, ~800° C. The silver may comprise sintered silver.

For AuSi, the bond may be formed by Si in the die mixing with Au on the back of the die and Au on the die carrier. For AuSn, the bond may form from the plated AuSn on the back of the die or a combination of Au and Sn plated on the back of the die, or plated selectively on the die carrier below where the die goes. The Ag bond may be formed by nano-Ag or micro-Ag attach material that is included in the interface. Thus, for high power applications, it is desirable to surface mount the one or more semiconductor dies of a semiconductor device using a robust, highly reliable die attach process, for example, a high temperature metallurgical bonding process such as gold-silicon bonding, gold-tin bonding, silver bonding, and so forth. In contrast, lead-free metallurgical die attach materials provide the package with a more environmentally-friendly characteristic and the use of a die attach comprising, for example, AuSi, AuSn, or Ag (with no epoxy). In addition, a Cu or other non-ceramic die carrier provides the package with its better thermal conductivity and lowered thermal resistivity, which produces improved reliability characteristics. This is in contrast to typical power packages that use relatively high resistivity die attach materials that have a high lead content, a large thickness, and a low thermal conductivity of approximately 20 to 30 W/m-K. Each of these characteristics contributes to heat transfer problems during device operation.

After the die is attached to the die carrier to form an assembly, the assembly is subsequently joined to a leadframe. Thus, higher amounts of non-flatness or camber of the die carrier may accommodated. For example, the camber of the die carrier may be up to about 5 mils, such as up to about 4 mils, at least 3 mils or at least 2 mils. The amount of acceptable camber of the die carrier may be in a range, such as about 2 mils to about 5 mils, about 3 mils to about 5 mils, or any other range between these values.

Figure 5:
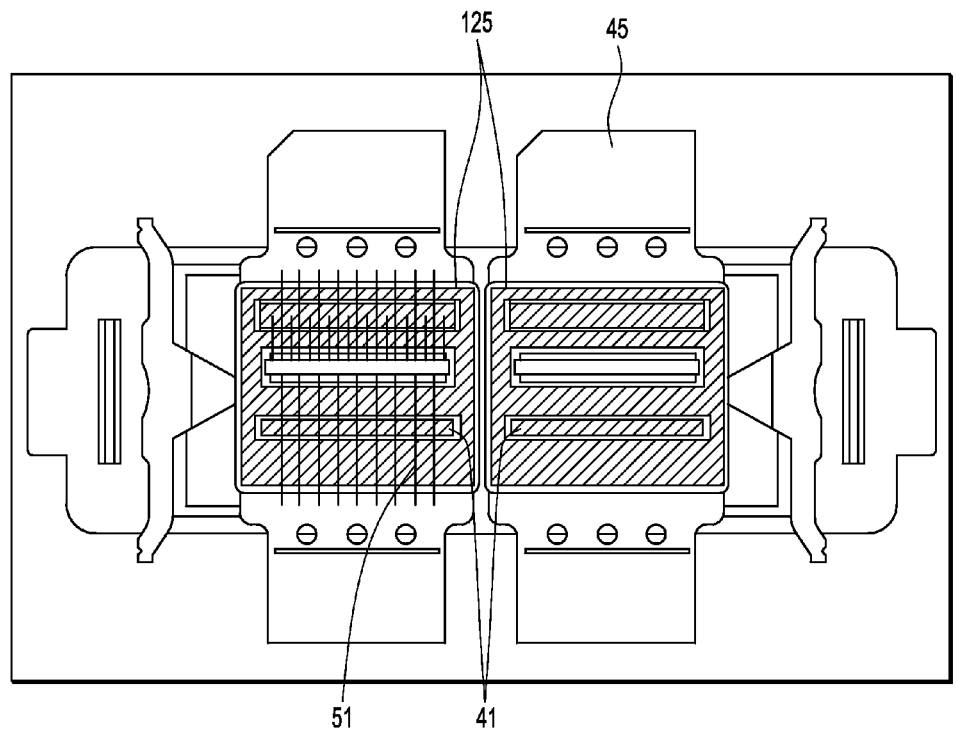
FIG. 5 is a top view of an embodiment of a portion of a packaged SD having a leadframe with leads.

FIGS. 4 and 5 illustrate particular embodiments of forming the SD 21. In FIG. 4, the assembly of FIG. 2 is shown attached and interconnected to a leadless leadframe 43. In FIG. 5, the assembly of FIGS. 3A and 3B is shown attached and interconnected to a leaded leadframe 45. The assemblies that include die carriers 25, 125 may be picked by automated packaging equipment and placed onto the leadframe. The die carrier may be bonded to the leadframe with a bond material 46 (FIG. 6), such as conductive epoxy. The conductive epoxy may be Pb-free. Alternatively, the die carrier may be bonded to the leadframe with a bond material 46 such as solder having a Pb-content of at least about 90%.

Figure 6:
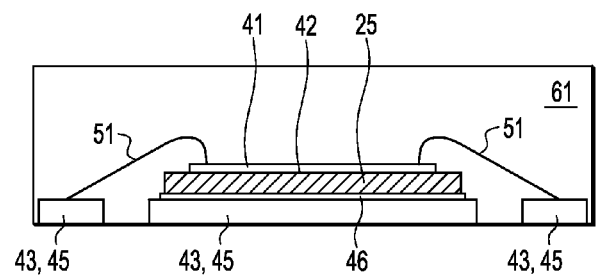
FIG. 6 is a schematic sectional side view of an embodiment of a portion of a packaged SD.

As shown in FIG. 6, one or more electrical interconnects 51 may be formed between the die 41 and the leadframe 43, 45. The electrical interconnects 51 may comprise bond wires or other types of interconnects, as will be discussed in greater detail below. In an embodiment, 2 mil gold wires may be utilized, and in another embodiment, 10 mil aluminum wires may be used. However, various known wires of varying materials and diameters may be utilized in accordance with particular design requirements.

In FIG. 6, a body 61 is formed using an encapsulating material that (when cured) forms a solid that substantially encapsulates the die carrier 25 and electrical interconnects 51. The body 61 has been formed to provide support thereto, such that the electrical interconnects 51 and die carrier 25 are substantially encapsulated e.g., housed, within body 61 to form a packaged device.

Figure 7A:
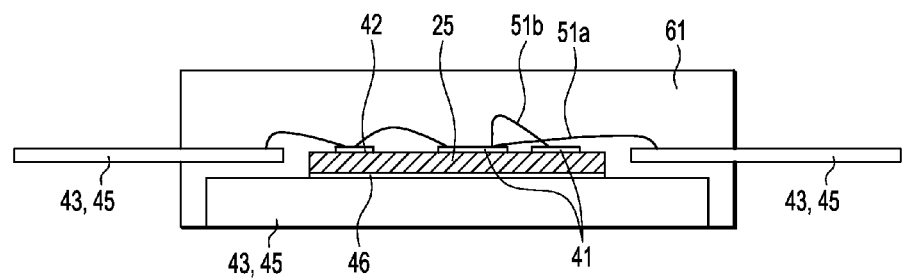
FIG. 7A is a schematic sectional side view of another embodiment of a portion of a packaged SD.
Figure 7B:
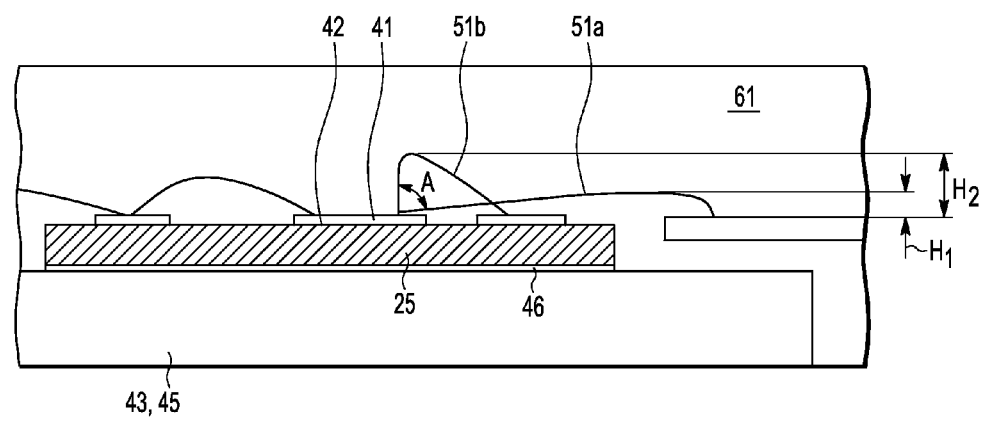
FIG. 7B is an enlarged schematic sectional side view of the portion of the packaged SD of FIG. 6A.

Another embodiment of forming SD 21 is depicted in FIGS. 7A and 7B. These figures are similar to the previous figures and therefore, the same reference numerals are maintained to represent the enumerated components. A housing 61, such as an encapsulating material, is deposited to form a package body that substantially encapsulates the components. As illustrated, the encapsulating material is a housing 61 located over each of the individual package workpieces to encapsulate the die carrier 25 or 125 and electrical interconnects 51 of each package workpiece. The housing 61 can be formed by depositing an encapsulation material, as previously described. Alternatively, the housing 61 may be an air housing, e.g. a cover which maintains an air space, overlying the components of each package workpiece. The air housing may comprise mounting a lid to the assembly to house the electrical interconnect in an air cavity, such that the electrical interconnect is free of encapsulation material. The housings may be formed over the workpieces, or they may be formed separately from the workpieces and then coupled together with the workpieces. As discussed previously, the housing 61 is chosen to support power dissipation capacity of between about 10 Watts to about 200 W, and to support high frequency RF applications.

In FIGS. 7A and 7B, a first electrical interconnect 51a (e.g., a series wire) may comprise a first loop height H1. A second electrical interconnect 51b (e.g., a shunt wire) may comprise a second loop height H2. In some embodiments, the second loop height H2 differs from the first loop height H1 by at least 15 mils. In other embodiments, the second loop height H2 differs from the first loop height H1 by about 20 mils to about 45 mils.

In some embodiments, portions of the shunt and series wires define an angle A therebetween as viewed along a plane of the surface of the die carrier 25. The angle A may be at least 80 degrees with respect to said portions. In some embodiments, the angle A is in a range of about 85 degrees to about 95 degrees, such as about 88 degrees to about 92 degrees, or even about 90 degrees.

In some embodiments, a packaged semiconductor device comprises a leadframe and a die carrier mounted to the leadframe. In some embodiments, the leadframe has leads, and in other embodiments the leadframe has no leads. The leadframe may be embedded in a circuit board. The die carrier comprises an electrically and thermally conductive material. A die is mounted to a surface of the die carrier with die attach material having a melting point in excess of 240° C. The die may comprise a plurality of die mounted to the surface of the die carrier. A first electrical interconnect may be coupled to the die and the leadframe. In addition, a solid body comprising overmold encapsulant may be on at least portions of the leadframe, die carrier, die and first electrical interconnect.

The packaged SD may further comprise a plurality of electrical interconnects including the first electrical interconnect and a second electrical interconnect. In some embodiments, the first electrical interconnect comprises at least one interconnect level comprising a conductive layer and a dielectric layer. The second electrical interconnect may shunt the die to itself. A second die may have a second electrical interconnect that extends from the die to the second die.

Embodiments of the packaged SD may further comprise an additional component mounted to the leadframe. For example, the additional component may comprise at least one of a capacitor, ceramic capacitor, MOS capacitor, inductor, resistor, ceramic and an integrated passive device (IPD). In additional embodiments, the die carrier may comprise a plurality of die carriers, each of which may have at least one die mounted thereto. The plurality of die carriers may be mounted to the leadframe.

Embodiments of a method of packaging a semiconductor device (SD) may comprise (a) providing a die carrier comprising an electrically and thermally conductive material; (b) melting a die attach material at a temperature in excess of 240° C. to attach a die to a surface of the die carrier to form a sub-assembly; (c) attaching the sub-assembly to a leadframe; (d) electrically interconnecting the die and the leadframe; and (e) enclosing at least portions of the die and leadframe to form a packaged SD.

In some embodiments of the method, (b) comprises mounting a plurality of die to the die carrier, and (d) comprises electrically interconnecting at least some of the die. In other versions of the method, (c) comprises bonding the sub-assembly to the leadframe with conductive epoxy, or bonding the sub-assembly to the leadframe with solder having a Pb-content of at least about 90%. In addition, (c) may comprise using a surface texture to attach the sub-assembly to the leadframe, and the surface texture is on one of the sub-assembly and the leadframe.

In still other embodiments of the method (d) may comprise shunting the die to itself, or shunting the die to another die. For example, (d) may comprises forming a wire bond, or connecting the die to the leadframe with a series wire, and forming a shunt wire. The method also may comprise (d) forming a first electrical interconnect at a first loop height, forming a second electrical interconnect at a second loop height, such that the second loop height differs from the first loop height by about 15 mils to about 45 mils. In the method, (d) may comprise forming an interconnect level having a conductive layer and a dielectric layer.

Other examples of the method include (e) comprising encapsulating said at least portions of the die and leadframe in a solid body to form the packaged SD. Alternatively, (e) may comprise housing said at least portions of the die and leadframe in an air frame to form the packaged SD.

Figure 8:
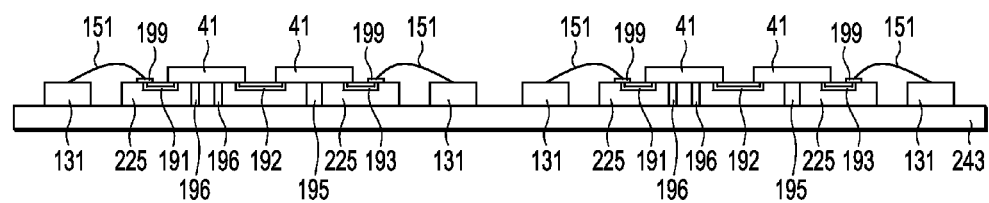
FIGS. 8-11 are schematic side views of other embodiments of portions of packaged SDs.

It will be appreciated, that many alternate embodiments of the described packaging process exist. For example, instead of a composite structure that includes die 41 attached to a conductive die carrier 25, other compound structures may be formed. For example, FIG. 8 illustrates a compound structure that includes die 41 attached to a printed circuit board 225 (PCB 225). The PCB 225 is illustrated to include conductive studs 195 (heat sinks), and interconnects including inter-level interconnects 191-193 and through vias 196. The conductive studs 195 can be formed from a material that provides greater thermal conductivity than the substrate of the PCB 225. For example, the conductive studs 195 can include copper, aluminum, other metals, the like, and combinations thereof. The die and die carrier assembly is thus mounted to PCB 225, which in turn is mounted to a leadframe 243.

Figure 9:
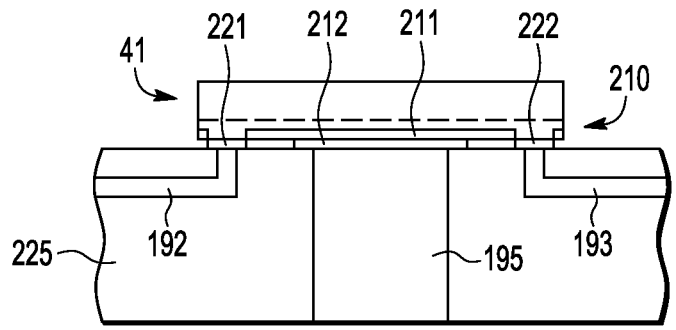

A particular embodiment of the compound structure that includes the die 41 and the PCB 225 is illustrated in greater detail at FIG. 9, which illustrates the die 41 mounted with its active surface 210 mounted facedown such that die bond pads 221 and 222 have been surface mount attached to the PCB 225. Interlevel routing 192 and 193 is illustrated as being in electrical contact with the die bond pads 221, 222, respectively. As illustrated in FIG. 9, interlevel routing 192 electrically connects the die bond pad 221 to a die bond pad of the adjacent die 41 that is attached to the same PCB 225. Interlevel interconnect 193 connects the die bond pad 222 to a PCB bond pad 199 of the printed circuit board 225 as also illustrated at FIG. 8. The conductive stud 195, which in effect is a sufficiently large heat sink to dissipate heat from die 41, is in contact with a heat conductive interface 212 (FIG. 9), such as a metallic pad, and extends through the PCB 225 to an opposing surface that is opposite the surface where the die 41 is mounted. The large heat conductive interface 212 overlies a dielectric region 211 that electrically isolates the heat conductive interface 212 from any underlying conductive features at the active region 210 of the die 41.

Figure 10:
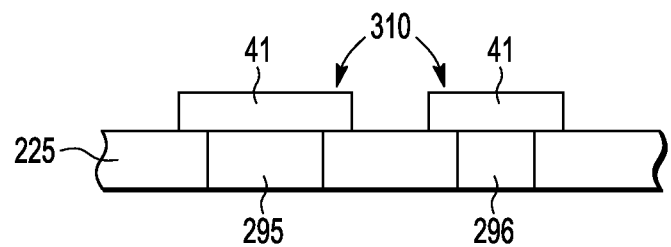

FIG. 10 illustrates an alternate embodiment of a compound structure that includes the dies 41 and a PCB 225. In particular, the dies 41 are mounted on conductive studs 295, 296, respectively, which themselves are formed through the PCB 225 to provide heat sink functionality. The resulting composite structure can be picked and placed with the die 41. Though not specifically illustrated, it will be appreciated that additional conductive routing can be implemented using inter-level interconnects formed within the PCB 225. In particular, bond pads can be formed near the periphery of PCB 225 that can be wire bonded directly to bond pads of die 41 using conventional wire bonding, while other bond pads can be formed near the periphery of PCB 225 that can be wire bonded directly to die carriers.

Figure 11:
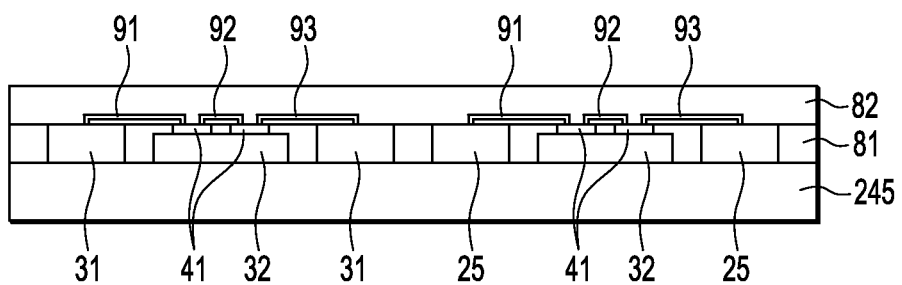

FIG. 11 illustrates an alternate embodiment of providing conductive interconnects between the die 41 and other die carriers 31, 32. In particular, instead of forming conventional wire bonds, additional layers are formed overlying the top side of the package device. For example, a body portion 81 comprises a dielectric material and additional conductive and dielectric layers are formed to implement conductive interconnects 91, 92, 93 between terminals, e.g., bond pads, of die 41 and die carriers 31, 32. Formation of inter-level interconnects eliminates the need for conventional wire bonding techniques. This assembly may then be mounted to a leadframe 245.

For clarity of illustration, different shading and/or hatching is utilized in the illustrations to distinguish the different elements of the semiconductor device. In addition, a term "horizontal" may be used herein to define a plane parallel to the plane or surface of the semiconductor device, regardless of its orientation. Thus, a term "vertical" refers to a direction perpendicular to the horizontal as defined. Terms, such as "above," "below," "top," "bottom," "side" (as in "sidewall"), "upper," "lower," and so forth are defined with respect to the horizontal plane.

This written description uses examples to disclose the embodiments, including the best mode, and also to enable those of ordinary skill in the art to make and use the invention. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A device, comprising:
   a package comprising:
   a die carrier comprising an electrically and thermally conductive material, wherein the die carrier has a thermal conductivity of at least 150 watts per meter Kelvin (W/in-K) and the die carrier has a thickness of at least 10 mils and less than 30 mils;
   a die; and
   die attach material attaching the die to the die carrier, and the die attach material has a melting point in excess of 240° C.

2. A device according to claim 1, wherein the die attach material comprises an element that is not present in the die carrier.

3. A device according to claim 2, wherein the element that is not present in the die carrier is gold.

4. A device according to claim 2, wherein the element that is not present in the die carrier is silver.

5. A device according to claim 1, wherein the die attach material comprises gold.

6. A device according to claim 1, wherein the die carrier has a camber of no more than 5 mils.

7. A packaged semiconductor device (SD), comprising:
   a leadframe;
   a die carrier mounted to the leadframe, the die carrier comprising an electrically and thermally conductive material, the die carrier having a thermal conductivity of at least 150 watts per meter Kelvin (W/m-K) and having a thickness of at least 10 mils and less than 30 mils;
   a die mounted to a surface of the die carrier with die attach material having a melting point in excess of 240° C.;
   a first electrical interconnect coupled to the die and the leadframe; and
   a solid body comprising overmold encapsulant on at least portions of the leadframe, die carrier, die and first electrical interconnect.

8. A packaged device according to claim 7, wherein the leadframe has leads, and the die is one of a plurality of die mounted to the surface of the die carrier.

9. A packaged device according to claim 7, further comprising a plurality of electrical interconnects including the first electrical interconnect and a second electrical interconnect, and the second electrical interconnect shunts the die to itself.

10. A packaged device according to claim 9, wherein the first electrical interconnect comprises a first loop height, and the second electrical interconnect comprises a second loop height, and the second loop height differs from the first loop height by at least 15 mils.

11. A packaged device according to claim 9, wherein the first electrical interconnect is a series wire, and the second electrical interconnect is a shunt wire.

12. A packaged device according to claim 11, wherein portions of the shunt and series wires define an angle therebetween as viewed along a plane of the surface of the die carrier, and the angle is at least 80 degrees with respect to said portions.

13. A packaged device according to claim 7, wherein the die and die carrier comprise a combined thickness that is substantially equal to a thickness of the leadframe.

14. A packaged device according to claim 7, wherein the die attach material comprises at least one of Au, and Ag.

15. A method, comprising:
attaching a die to a die carrier using a die attach material, the die attach material having a melting point in excess of 240° C.; and
packaging the die, the die carrier, and the die attach material, the die carrier comprising an electrically and thermally conductive material, the die carrier having a thermal conductivity of at least 150 watts per meter Kelvin (W/m-K), and the die carrier having a thickness of at least 10 mils and less than 30 mils.

16. A method according to claim 15, wherein the die attach material comprises an element that is not present in the die carrier.

17. A method according to claim 16, wherein the element that is not present in the die carrier is gold.

18. A device according to claim 16, wherein the element that is not present in the die carrier is silver.

19. A device according to claim 15, wherein the die attach material comprises gold.

20. A device according to claim 15, wherein the die carrier has a camber of no more than 5 mils.

* * * * *